US007117460B2

(12) United States Patent
Chang et al.

(10) Patent No.: US 7,117,460 B2
(45) Date of Patent: Oct. 3, 2006

(54) METHOD FOR PHYSICAL PARAMETER EXTRACTION FOR TRANSISTOR MODEL

(75) Inventors: Shou-Zen Chang, Panchiao (TW); Wei-Ming Chen, Hsin Chu (TW); Hsien-Pin Hu, Hsinchu (TW); Chia-Nan Lee, Hsin Chu (TW)

(73) Assignee: Taiwan Semiconductor Manufacturing Co., Ltd., (TW)

( * ) Notice: Subject to any disclaimer, the term of this patent is extended or adjusted under 35 U.S.C. 154(b) by 310 days.

(21) Appl. No.: 10/794,003

(22) Filed: Mar. 4, 2004

(65) Prior Publication Data

US 2005/0198603 A1    Sep. 8, 2005

(51) Int. Cl.
*G06F 17/50*    (2006.01)
*G06F 19/00*    (2006.01)

(52) U.S. Cl. .................. 716/4; 716/8; 716/21; 700/97; 700/110

(58) Field of Classification Search .................... 716/4, 716/8, 21; 700/97, 110
See application file for complete search history.

(56) References Cited

U.S. PATENT DOCUMENTS

| | | | |
|---|---|---|---|
| 7,030,966 B1* | 4/2006 | Hansen | 355/67 |
| 2004/0153979 A1* | 8/2004 | Chang | 716/4 |
| 2005/0076316 A1* | 4/2005 | Pierrat et al. | 716/4 |
| 2005/0132306 A1* | 6/2005 | Smith et al. | 716/1 |
| 2005/0289500 A1* | 12/2005 | Misaka et al. | 716/19 |

OTHER PUBLICATIONS

Wallmark, "A Statistical Model for Determining the Minimum Size in Integrated Circuits", IEEE Transactions on Electron Devices, vol. ED-26, No. 2, Feb. 1979, pp. 135-142.*
Takeda et al., "A Cross Section of α-Particle-Induced Soft-Error Phenomena in VLSI's", IEEE Transactions on Electron Devices, vol. 36, No. 11, Nov. 1989, pp. 2567-2575.*
Yan et al., "Architecture of a Pos-OPC Silicon Verification Tool", Proceedings of the 5th International Conference on ASIC, vol. 2, Oct. 21, 2003, pp. 1365-1368.*
Yanagawa, "Yield Degradation of Integrated Circuits Due to Spot Defects", IEEE Transactions on Electron Devices, vol. 19, No. 2, Feb. 1972, pp. 190-197.*
Michael Orshansky et al., "Impact of Spatial Intrachip Gate Length Variability on the Performance of High-Speed Digital Circuits", IEEE Transactions on Computer-Aided Design of Integrated Circuits and Systems, vol. 21, No. 5, May 2002, pp. 544-553.
Li Chen et al., "Analysis of the Impact of Proximity Correction Algorithms on Circuit Performance", IEEE Transactions on Semiconductor Manufacturing, vol. 12, No. 3, Aug. 1999, pp. 313-322.

* cited by examiner

*Primary Examiner*—Phallaka Kik
(74) *Attorney, Agent, or Firm*—Duane Morris

(57) ABSTRACT

A method is disclosed for modifying a device dimension extraction model. After collecting in-line data with regard to at least one feature of a device for one or more layouts, a proximity and linearity effect with regard to the feature based on the collected data is determined. Further, the device's electrically active region (OD) drawn size effect with regard to the feature is also determined based on the collected data. The dimension extraction model is modified based on at least two of the above three characterized effects.

21 Claims, 4 Drawing Sheets

METHOD FOR PHYSICAL PARAMETER EXTRACTION FOR TRANSISTOR MODEL

BACKGROUND

The present disclosure relates generally to semiconductor device modeling and manufacturing, and more particularly to the methods for correlating transistor models to the fabricated features of the device transistors.

The production of semiconductor integrated circuits (ICs) and devices requires the use of many steps to define and fabricate specific circuit components and circuit layouts onto an underlying substrate. These steps include design processes (function design, logic design, physical/layout designs and the like), manufacturing processes (material, device fabrication and the like) and test processes (device physical, electrical, functionality testing and the like). The design processes include modeling methods by which certain physical dimensional aspects of the device's transistors are correlated to certain electrical parametric performances of the transistors. Such transistor models are used to help extract and define the initial manufacturing fabrication parameters, as well as for determining changes and re-targets to the fabricated transistor physical dimensional features to re-center their electrical parametric performances.

Device circuits utilizing field-effect transistors (FETs) are commonly modeled to determine the transistors' gate polysilicon electrode length, the dimensional length of the physical channel between the transistors' source and drain regions. The OD area width, the transistors' electrically active region under the gate poly-silicon electrode, is also a modeled parameter that correlates strongly to device transistor performance. It is important from the view of the device designers and for the manufacturing operations, that the extraction models for transistor gate length and OD area width reliably and accurately predict and represent the electrical characteristics of the transistors.

Typical transistor models, such as the SPICE model for example, translate the modeled (drawn) gate length and OD area width parameters to the actual physically measured dimensions for the fabricated transistors. Such models correct or correlate the modeled, drawn gate poly-silicon length and area width dimensions to the actual fabricated transistor CD (critical dimension) values by either a fixed CD offset modification, or by a differently specified offset value applied to the in-line fabrication operations. These transistor models extract corrected transistor physical dimensional parameters that are usually optimized for a specific device transistor layout style and pattern. In actuality, due to certain real-life process issues, the transistor models are often not optimal for all varieties of device transistor layout styles and patterns. As example, for the advanced device process technologies with gate lengths of less than 65 nm (nanometer) and OD area widths around 110 nm, certain systematic process phenomena and issues may induce as much as and larger than 10% drifts to the final electrical performance parameters of the transistors. As a result, the transistor models experience non-modeled inaccuracies and additional offset errors between the actual fabricated device transistors and the expected electrical performance characteristics of the same. Such inaccuracies and errors may occur not only between one product device to another, but also between different operating circuits within a given device. As device transistor dimensional geometries shrink with the more advanced device and process technology generations, the issues and difficulties for maintaining reliable and accurate transistor models become more important for maintaining device performance and high production/device yields.

The flow diagram 100 of FIG. 1 illustrates a method for correcting and correlating the transistor gate length and OD area width parameters to the transistor electrical performance parameters. Both flows require the use of collected data, the in-line measured transistor CD data from the transistors during fabrication and the measured electrical performance data taken from the fabricated transistors. The in-line CD data collection is shown as step 102 of both flow diagrams. The collection of transistor electrical data is shown as the next step 104 of both flow diagrams. In FIG. 1, in the next step 106, the collected in-line CD and final transistor electrical data are used to calculate and determine correction, offset factors to be applied within the transistor model such that the corrected, offset CD parameters of the model match that of the measured in-line CD data. The new correction, offset factors are then applied to the transistor model, shown as step 108 of FIG. 1. The transistor model is subsequently used for extraction of electrical performance for device transistors with a variety of layouts.

Accordingly, it is desirable to have an improved method for modeling transistors such that the physical parameters of the transistor features are correlated well to the electrical performance of the same.

SUMMARY

A method is disclosed for modifying a device dimension extraction model. After collecting in-line data with regard to at least one feature of a device for one or more layouts, a proximity and linearity effect with regard to the feature based on the collected data is determined. Further, the device's electrically active region (OD) drawn size effect with regard to the feature is also determined based on the collected data. The dimension extraction model is modified based on at least two of the above three characterized effects.

These and other aspects and advantages will become apparent from the following detailed description, taken in conjunction with the accompanying drawings, illustrating by way of example the principles of the disclosure.

DESCRIPTION

The present disclosure describes an improved method for modeling transistors such that the physical parameters of the transistor features are models based upon the density level of the fabricated features or structures for a given circuit layout pattern. Specifically, the dimensional pitch (distance)

between the structures of different transistors may be different for certain circuit layouts. Transistors that are located far from one another are also known as in an "isolated" pattern layout, versus a circuit layout where transistors are located close to each other, known as in a "dense" pattern layout. The dense circuit pattern may be said to experience proximity effects due to the differences of how certain in-line fabrication processes perform upon the structures that are located close to each other versus the structures that are further away from each other. The level of proximity effect is usually proportionally a function of the transistor layout density.

Figure 1:
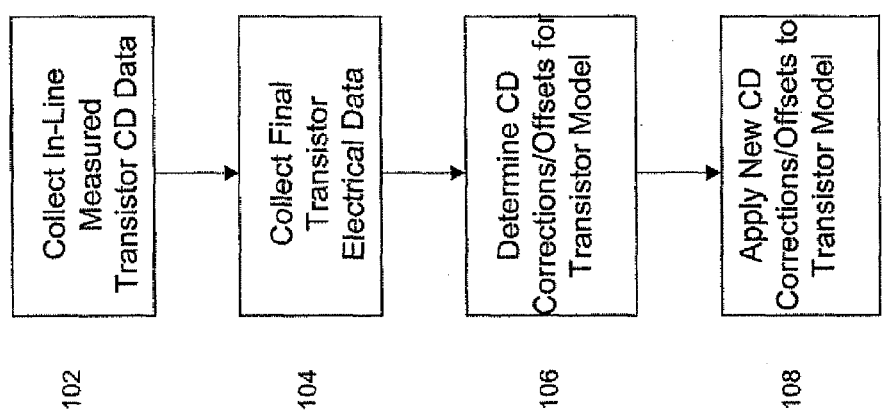
FIG. 1 is a flow diagram illustrating the steps used by the typical transistor models to extract and predict the fabrication physical transistor parameter correlations to the electrical characteristics of the same.
Figure 2A:
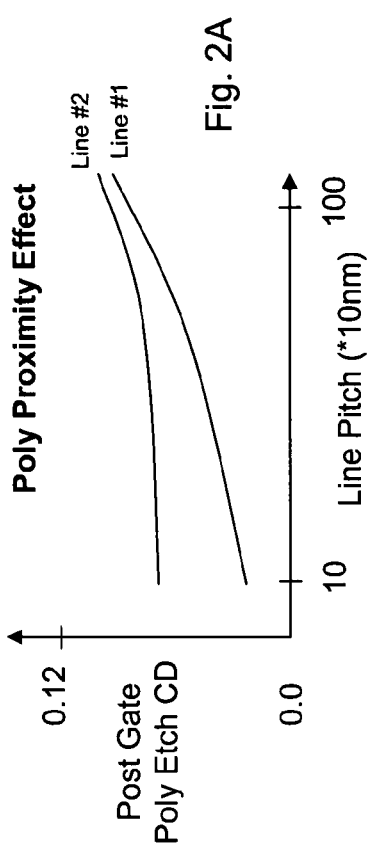
FIGS. 2A through 2C are graphs to illustrate three process effects that may influence the reliability and accuracy of the transistor models.

FIG. 2A is a basic data graph that illustrates the proximity effect upon etched poly-silicon lines of the transistor gate electrodes. The graph's x-axis represents the pitch between the gate electrode lines of adjacent transistors. The y-axis of the graph represents the measured gate length CD of the transistor gate line after its definition via the poly-silicon gate etch process. The two data curves of the graph show how two transistor gate lines may behave with respect to varying pitch distances between adjacent gate lines. The measured gate poly CD of each transistor gate line, post etch, is shown to behave differently with the different line pitches. The effect of this behavior is also known as the proximity effect due to the density level of the device transistor layout pattern. With the use of such characterizations for the proximity phenomenon, the methods established within a transistor model may be improved such that the proximity effect is an independently, addressable variable of the model.

Another process phenomenon that may influence the correction, correlation offsets in the transistor models between the actual fabricated device transistors and the expected electrical performance characteristics is the "linearity" effect. The linearity phenomenon is also experienced with the fabrication processes which process upon the transistor structures during the device production. The linearity effect influences the correction, correlation offsets of the transistor models based upon the length of the gate line feature of the fabricated device for a given circuit layout pattern. Specifically, the transistor dimensional offsets may be different for a circuit layout where transistors' gate line structures are of relatively long length versus a circuit layout where transistors' gate line structures are of shorter length. The circuit pattern may be said to experience linearity effects due to the differences of how certain in-line fabrication processes perform upon structures that are of differing lengths. The level of linearity effect is usually proportionally a function of the transistor gate line lengths.

Figure 2C:
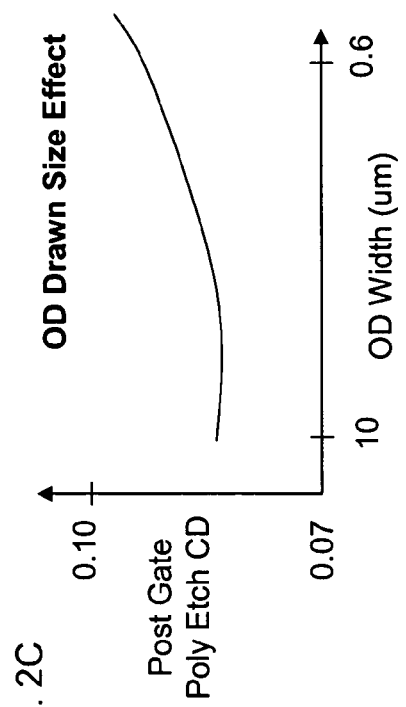
Figure 2B:
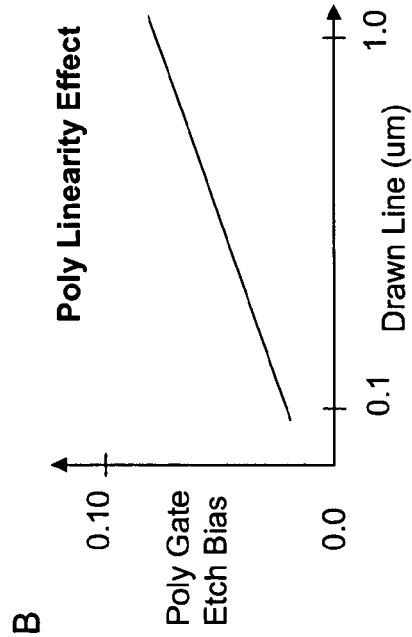

FIG. 2B is a basic data graph that illustrates the linearity effect upon the process used for etching the poly-silicon lines of the transistor gate electrodes. The graph's x-axis represents the line length of the gate electrode for a given transistor. The y-axis of the graph represents the measured bias effect induced upon the gate poly-silicon etching process for the transistor gate line. The data curve of the graph shows the effect of how the bias of the etch process is effected due to the length of the transistor gate lines. The measured gate etch bias is shown to vary as a function of the transistor gate line length. The effect of this behavior is known as the linearity effect due to the gate line length of the transistors. In a device layout comprising of many transistors of different gate line lengths, it is desirable to use a transistor model that can independently address the variety of transistor gate line lengths within the device transistor pattern layouts. It is understood that the above described proximity and linearity effects apply both to the poly and OD features.

A third process phenomenon that may influence the correction, correlation offsets in the transistor models between the actual fabricated device transistors and the expected electrical performance characteristics is the "OD drawn size" effect. The OD drawn size phenomenon is also experienced with the fabrication processes which process upon the transistor structures during the device production. The OD drawn size effect influences the correction, correlation offsets of the transistor models based upon the offset between the area width dimensions from the modeled, drawn transistor versus the actual fabricated transistor CD (critical dimension) length values. It is noted that the typical transistor models may use an OD drawn width dimension effect as the only general transistor model correction, correlation factor to address all process phenomenon in totality. The OD drawn area size effect, when addressed in addition to the proximity and linearity phenomena as a separately modeled effect, is more specific as it does not account for either the proximity or the linearity effects.

FIG. 2C is a basic data graph that illustrates the OD drawn size effect upon the etched poly-silicon lines of the transistor gate electrodes. The graph's x-axis represents the OD widths of the gate electrodes for a given transistor. The y-axis of the graph represents the measured gate length CD of the transistor gate line after its definition via the poly-silicon gate etch process. The data curve of the graph shows how varying OD widths affect the measured gate line CDs of the post-etched transistor gates. The measured gate poly CD of each transistor gate line, post etch, are shown to behave differently with the varying transistor OD widths. This behavior, known as the OD drawn width size effect, is experienced with device transistor layouts comprising of transistors with varying OD drawn widths. With the use of such characterizations for the OD drawn width size phenomenon, the methods established within a transistor model may be improved such that the OD drawn width size effect is an independently, addressable variable of the model.

The above three discovered factors affect the electrical performance of the semiconductor devices. For example, the saturation current Idsat is a benchmark for indicating how these three process induced effects influence the electrical performance of the device. Compensation mechanism for these three effects is desired and described below.

Figure 3:
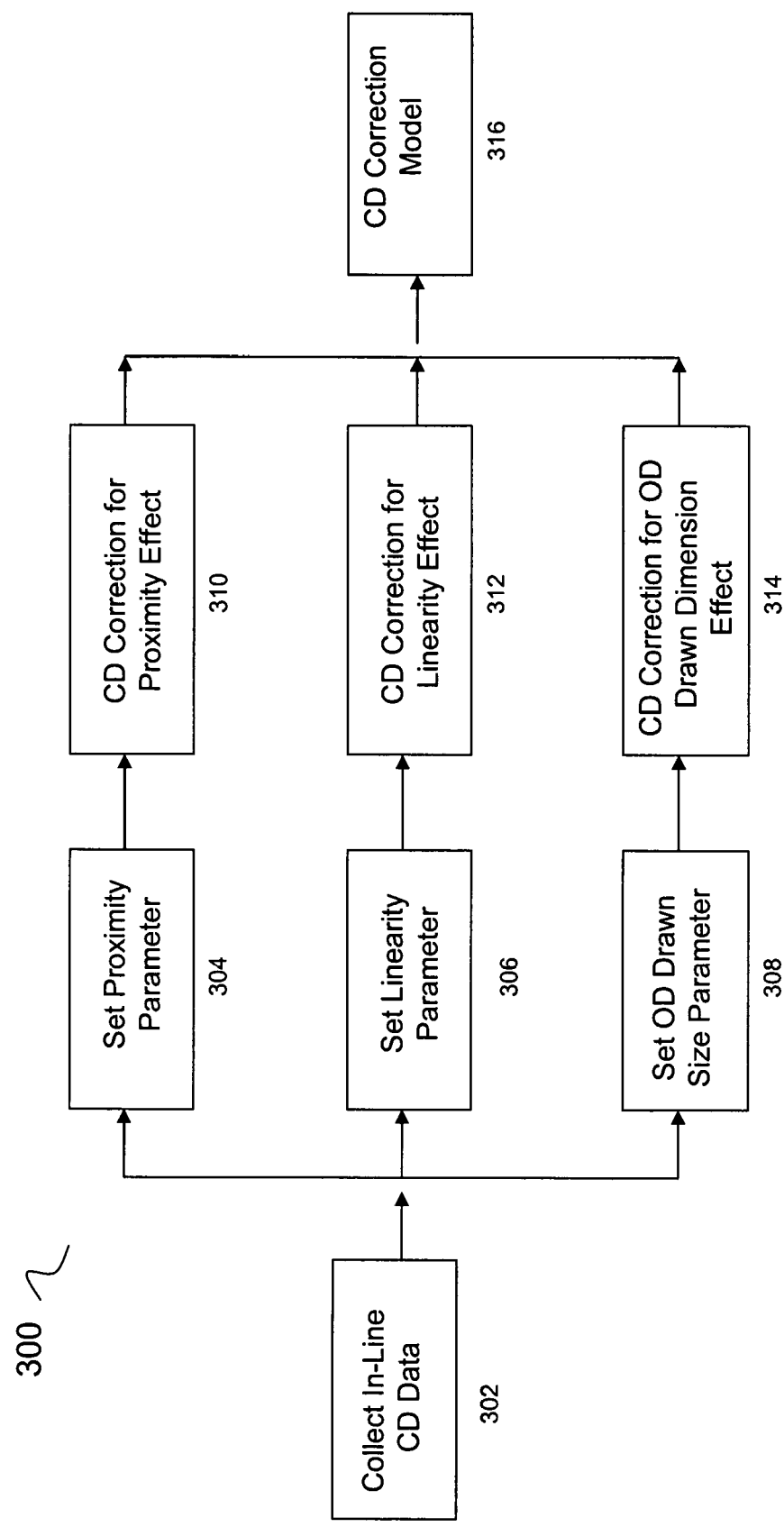
FIG. 3 is a flow diagram to illustrate the use of in-line process data for the establishment and setting of the three process effects' correction/offset factors for application within the transistor models.

Referring now to FIG. 3, there is a flow diagram 300 illustrating one aspect of an improved method for modeling transistors such that the physical parameters of the transistor features are correlated well to the electrical performance of the same. The method described, in accordance with the disclosure, incorporates three previously discussed process induced effects as separate, independent input variables to the transistor model. In this example, poly-silicon electrode CD model is used as an example, but it is understood that the same methodology can be applied to various other device features. The use of more than one variable used in conventional, typical transistor models, allows for greater model reliability and accuracy for the correlation and prediction of the transistor modeled physical dimension features and electrical performance, to the actual fabricated features and performance.

Flow diagram 300 shows that by collecting the in-line CD data based on different layouts of a feature such as a poly in step 302, the characterizations of the three process effects (proximity, linearity, and OD drawn size) are obtained. The in-line CD data are usually measured from the devices after one or more predetermined fabrication processes such as etching or photolithography process. The characterization can be done by standard computer systems with specific program written for processing the collected data for finding correlations with regard to these three effects. It is noted that engineering analysis techniques such as designs of experimentation, data mining, and historical data correlations are used to establish process characterizations between transistor electrical parameters to the processing parameters of the three processes (proximity, linearity and OD drawn size). Based on the characterization, one or more correction parameters are set shown as step 304–308 of the flow diagram. Once the correction parameters are set, the parameters are applied to compensate the CD variables of the transistor model in steps 310–314. This improved transistor CD correction model is generated in step 316, and may now be used to extract new device transistor modeled CD parameters with greater reliability and accuracy. It is understood that the final CD parameters may also be based on in-line calibration data.

It is further understood that in semiconductor design, poly and OD are two elements that determine the layout and the performance of the transistors. As such the above described proximity and linearity phenomena may be individually known as poly proximity, poly linearity, OD proximity, and OD linearity. They may be individually studied for generating the improved transistor model. Although FIG. 3 shows that all separate routes (304–308) for setting the parameters, it is understood that not all three are required in all instances. In some cases, only one or two out of the three routes are necessary.

Figure 4:
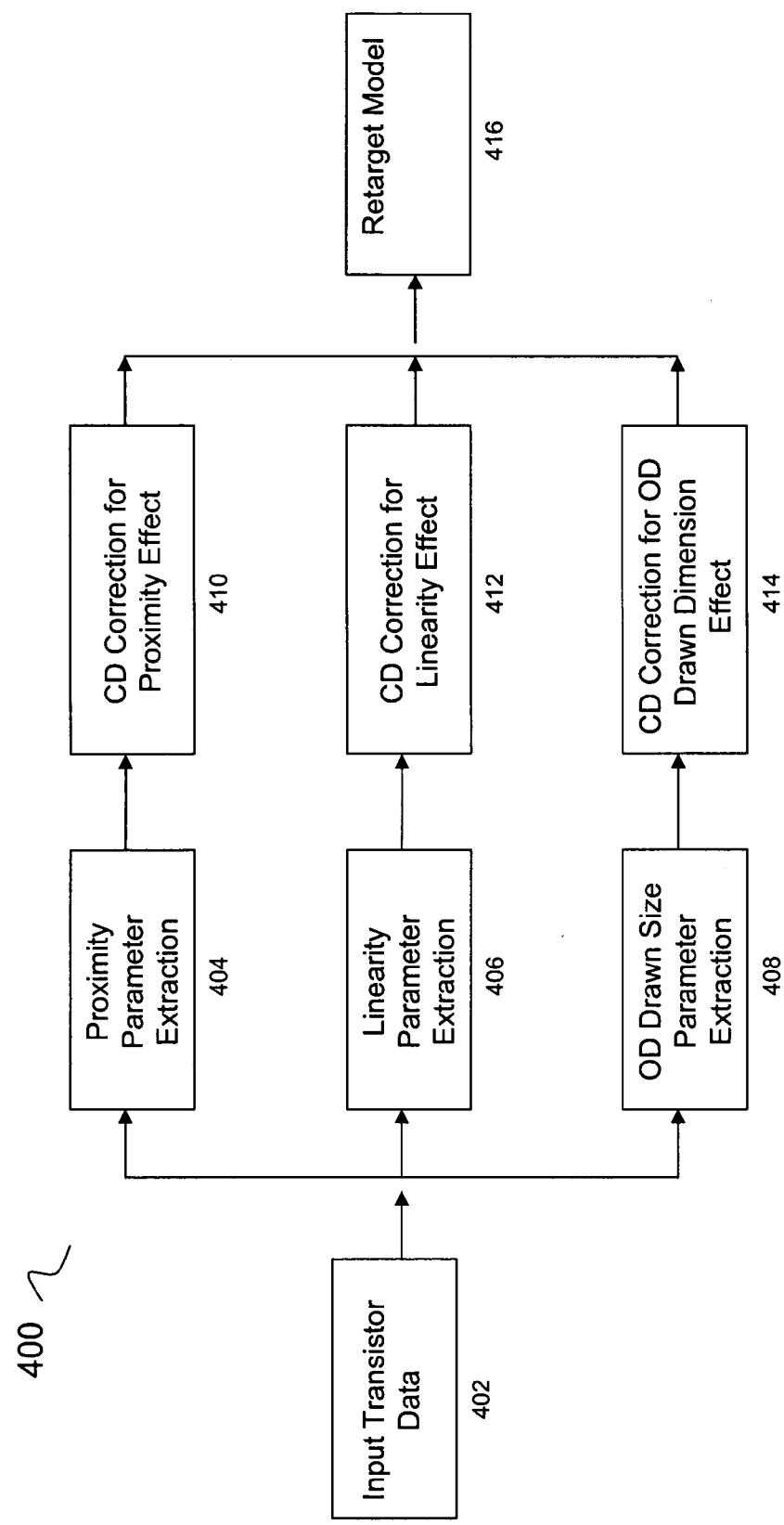
FIG. 4 is a flow diagram to illustrate the use of transistor electrical performance data for the establishment and setting of the three process effects' correction/offset factors for application within the transistor models.

FIG. 4 illustrates the flow diagram 400 for modeling transistors such that the physical parameters of the transistor features are correlated well to the electrical performance of the same. This aspect of the method described, in accordance with the disclosure, also incorporates the three previously discussed process effects as separate, independent input variables to the transistor model. Flow diagram 400 shows that after receiving the expected fabricated transistor's physical data 402, in order to obtain the desired electrical performance of the transistor, the proximity parameters, linearity parameters, and OD drawn size parameters derived from the process as illustrated in FIG. 3 are extracted in steps 404–408. The CD correction is then conducted based on the derived parameters in steps 410–414. The re-target model of the CD is then obtained in step 416. Depending on the need, the final output of this step 416 may be either a re-targeted CD, which becomes an input for the transistor model, or device performance data based on a combination of both the re-targeted CD and the original model. The disclosed method allows for greater model reliability and accuracy for the correlation and prediction of the transistor modeled physical dimension features and electrical performance, to the actual fabricated features and performance.

The present disclosure provides an improved method for modeling transistors such that the physical parameters of the transistor features are correlated well to the electrical performance of the same. The disclosed method, through the use of separate independent sets of parameters for the determination of effects of three strong process phenomena known to affect transistor performance, allows for a more reliable and accurate transistor model. Such an improved transistor model will remain reliable and accurate when used and applied across a large variety of device transistor layout styles, patterns and device/process technologies.

The disclosed methodology does not require additional time-consuming, expensive hardware or specialized analytical tools. The method of the disclosure features the usage of existing physical in-line, electrical performance and process characterization data to incorporate within the improved transistor model. The method disclosed is suitable and compatible for implementation within existing, conventional and future semiconductor production operations. The transistor modeling aspects of the disclosed method are well suited for implementation within factory automation and/or virtual specification systems such that fabrication process parameters and model corrections/offset adjustments may be defined and accomplished seamlessly, requiring little or no additional attention from the engineering and manufacturing personnel.

The above disclosure provides several examples for implementing the different features of the disclosure. Specific examples of components and processes are described to help clarify the disclosure. These are, of course, merely examples and are not intended to limit the scope of the disclosure from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A method for modifying a device dimension extraction model comprising:
    collecting in-line data that represents at least one feature of a device for one or more layouts;
    characterizing a proximity effect on the feature based on the collected data;
    characterizing a linearity effect on the feature based on the collected data;
    characterizing the device's electrically active region (OD) drawn size effect on the feature based on the collected data;
    modifying the dimension extraction model based on at least two of the above three characterized effects; and
    applying the modified model to extract one or more physical dimensions of the feature.

2. The method of claim 1 wherein the collecting further includes collecting physical critical dimension data measured from the device after a predetermined fabrication process.

3. The method of claim 1 wherein the collecting further includes collecting electrical performance data of the device.

4. The method of claim 1 wherein the modifying further includes modifying the dimension extraction model based on all three characterized effects.

5. The method of claim 1 wherein the modifying further includes setting one or more proximity parameters for compensating the proximity effect.

6. The method of claim 5 wherein the one or more proximity parameters are for compensating dimensions of a poly gate and an active region under the poly gate.

7. The method of claim 5 wherein the modifying further includes setting one or more linearity parameters for compensating the linearity effect.

8. The method of claim 7 wherein the one or more linearity parameters are for compensating dimensions of a poly gate and an active region under the poly gate.

9. The method of claim 1 wherein the feature is a poly gate.

10. The method of claim 9 wherein the modifying further includes setting one or more OD drawn size parameters for compensating the OD drawn size effect on the poly gate.

11. A method for generating a dimension extraction model for reducing process induced errors in making a device, the method comprising:

collecting in-line data that represents a poly gate and an active region under the poly gate (OD) of a device for one or more layouts;

characterizing a proximity effect on the poly gate and OD based on the collected data;

characterizing a linearity effect on the poly gate and OD based on the collected data;

characterizing the device's OD drawn size effect on the poly gate based on the collected data;

modifying the dimension extraction model based on at least two of the above three characterized effects; and applying the modified model to extract one or more physical dimension parameters for a semiconductor device.

12. The method of claim 11 wherein the data includes physical critical dimension data measured from the device after one or more predetermined fabrication processes.

13. The method of claim 11 wherein the data further includes electrical performance data.

14. The method of claim 11 wherein the modifying further includes setting one or more proximity parameters for compensating the proximity effect.

15. The method of claim 11 wherein the modifying further includes setting one or more linearity parameters for compensating the linearity effect.

16. The method of claim 11 wherein the modifying further includes setting one or more OD drawn size parameters for compensating the OD drawn size effect on the poly gate.

17. A computer program embedded on a computer-readable medium for modifying a dimension extraction model for reducing process induced errors in making a semiconductor device, the program comprising instructions for:

collecting in-line data that represents a poly gate and an active region under the poly gate (OD) of a device for one or more layouts;

characterizing a proximity effect on the poly gate and OD based on the collected data;

characterizing a linearity effect on the poly gate and OD based on the collected data;

characterizing the device's OD drawn size effect on the poly gate based on the collected data;

modifying the dimension extraction model based on at least two of the above three characterized effects; and applying the modified model to extract one or more physical dimension parameters for the semiconductor device.

18. The program of claim 17 wherein the data includes physical critical dimension data measured from the device after one or more predetermined fabrication processes and electrical performance data.

19. The program of claim 17 wherein the instructions for modifying further include instructions for setting one or more proximity parameters for compensating the proximity effect.

20. The program of claim 19 wherein the instructions for modifying further include instructions for setting one or more linearity parameters for compensating the linearity effect.

21. The program of claim 20 wherein the instructions for modifying further include instructions for setting one or more OD drawn size parameters for compensating the OD drawn size effect on the poly gate.

* * * * *